United States Patent [19]

Whiffen

[11] 4,245,192
[45] Jan. 13, 1981

[54] PERIODICITY VERIFICATION CIRCUIT

[75] Inventor: Maurice C. Whiffen, Marietta, Ga.

[73] Assignee: Lockheed Corporation, Burbank, Calif.

[21] Appl. No.: 952,820

[22] Filed: Oct. 19, 1978

[51] Int. Cl.³ .......................... H03K 9/04; H03K 9/06; H03K 5/153

[52] U.S. Cl. .................................... 328/140; 328/127; 328/147; 328/149; 328/109; 328/117; 328/114; 307/358

[58] Field of Search ............... 328/134, 140, 141, 146, 328/147, 149, 109, 114, 117, 127; 307/358

[56] References Cited

U.S. PATENT DOCUMENTS

| 3,336,485 | 8/1967 | Scarpa | 328/146 X |
| 3,372,234 | 3/1968 | Bowsher et al. | 328/146 X |
| 3,404,345 | 10/1968 | Marx et al. | 328/141 |
| 3,515,997 | 6/1970 | Babany | 328/134 |

Primary Examiner—John S. Heyman
Attorney, Agent, or Firm—John J. Sullivan

[57] ABSTRACT

A circuit for high speed testing of the periodicity of an alternating signal (60) independently of signal amplitude. A bistable multivibrator (128) changes state in response to each positive slope zero-crossing of the signal and alternately activates each of a pair of integrators (116, 118, 180 and 117, 114, 181) on alternate cycles of the signal. A pair of high speed gated comparators (112, 115) compares the integrator voltages at the end of each pair of cycles. A reference voltage (130) which increases with the number of cycles is provided to maintain a narrow comparator window as the integrator voltages increase.

7 Claims, 5 Drawing Figures

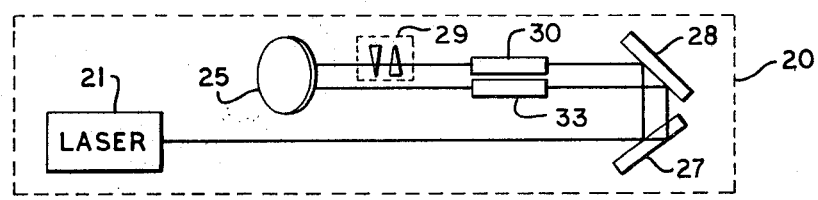
Fig_1B
Fig_1C
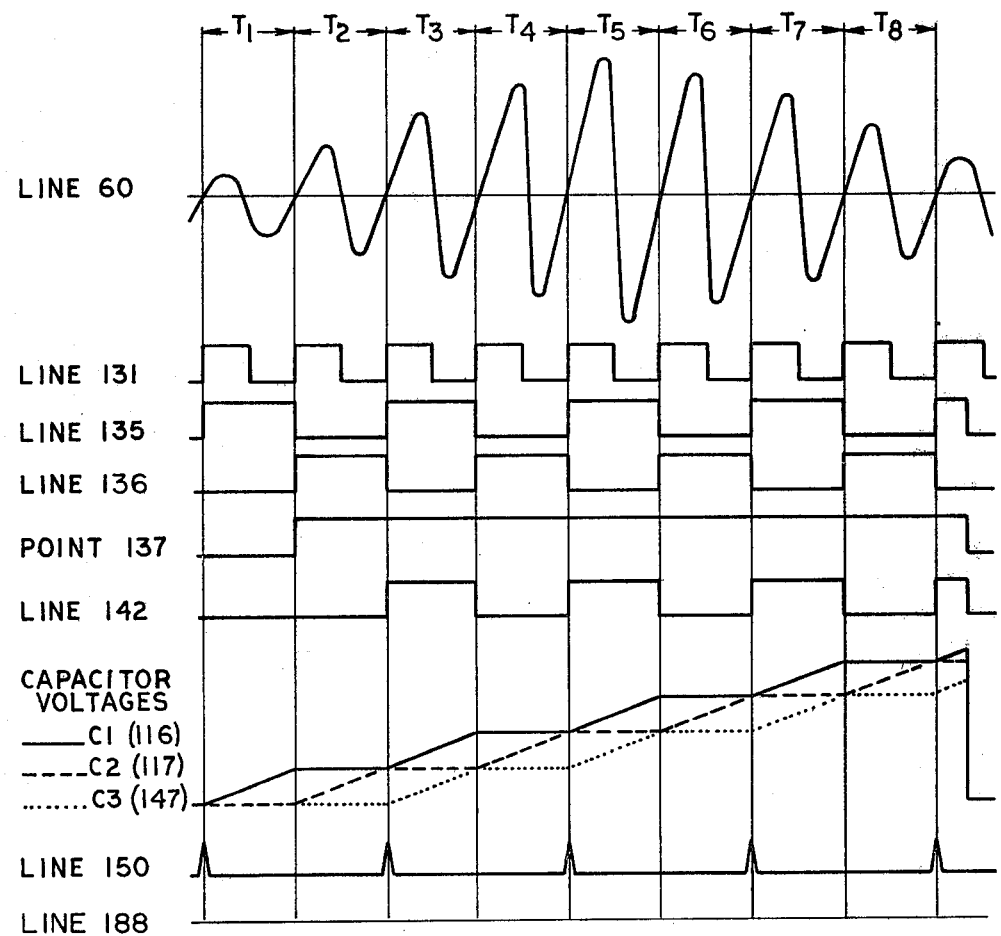
Fig_2A

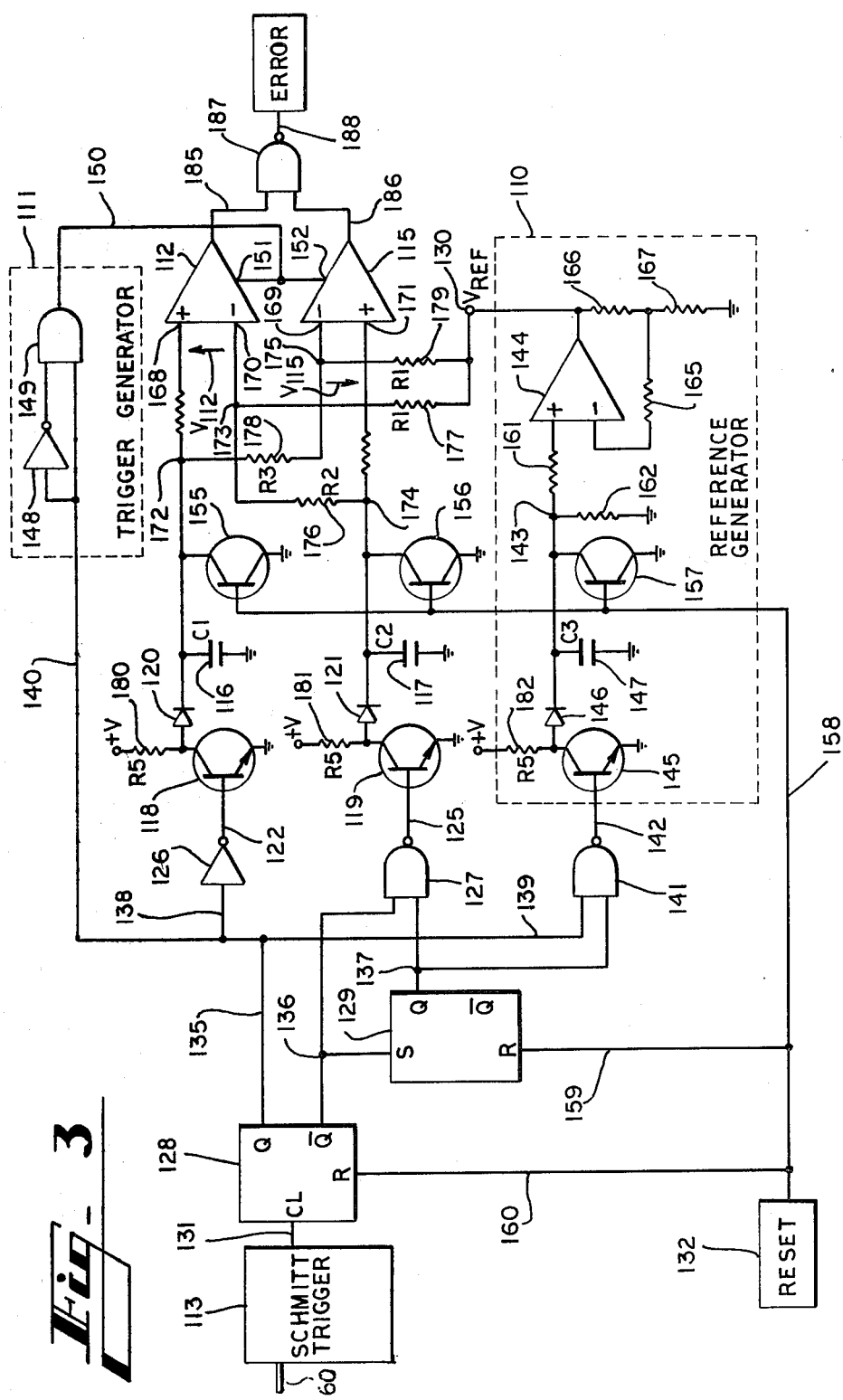

PERIODICITY VERIFICATION CIRCUIT

DESCRIPTION

1. Technical Field

The present invention relates to electronic signal processing and more particularly to processing signals to determine the presence of a periodic characteristic in an alternating signal. The present invention is particularly useful in applications such as laser velocimetry wherein high speed, period by period testing of periodicity is required.

2. Background Art

In the processing and analysis of electronic signals, it is sometimes necessary to determine whether an alternating signal present at a particular input is periodic in nature. The field of laser velocimetry is one field which often gives rise to the necessity of determining whether a signal is periodic. Technical report AFAPL-TR-76-65 entitled "The Generation and Radiation of Supersonic Jet Noise, Volume 2, Studies of Jet Noise, Turbulence Structure and Laser Velocimetry" prepared for the Air Force Aero Propulsion Laboratory of the Air Force Systems Command, describes a laser velocimeter in which it is necessary to determine the periodicity of a signal corresponding to scattered light impinging upon a photo-detector. The field of laser velocimetry involves varying signals of high frequency and in such an application it becomes necessary to test for periodicity of high frequency signals.

Periodicity verification in the laser velocimeter of the above mentioned report was accomplished by comparing the time taken for a first set of zero crossings to occur to the time taken for a second set of zero crossings to occur. The main drawback of this method is that it allows a nonperiodic signal to appear to be periodic if the same error appears in the times required for both sets of signal crossings. This is easy to understand in that this prior method of determining signal periodicity compared a set of average times for multiple zero crossings of the signal to occur.

DISCLOSURE OF THE INVENTION

In accordance with the present invention, the periodicity of an alternating signal is tested on a period by period basis by comparing the voltages present on a pair of capacitors which are alternately charged during alternate cycles of a varying input voltage. The charge which is placed on the first capacitor is proportional to the time between the first and second positive going zero crossings of the alternating input signal, and the charge on the second capacitor is proportional to the time between the second and third positive going zero crossings. At the end of each charging cycle for the second capacitor, a narrow gate pulse is provided to a pair of high speed gated comparators which determine, within a small margin of error, if the charges on the capacitors are equal. This process may be continued through a predetermined number of cycles of the input signal.

According to another aspect of the present invention the error window of the comparators is maintained as the charges on the capacitor increase by providing a variable reference voltage which increases as the number of cycles being compared increases.

BRIEF DESCRIPTION OF THE DRAWINGS

FIG. 1B is a top view of the beam splitting and frequency shifting apparatus of the laser velocimeter of FIG. 1.

FIG. 1C is a cross sectional beam pattern of the laser velocimeter of FIG. 1A.

FIG. 2A is a timing diagram of varying waveforms which appear in the present invention when the input signal is periodic.

FIG. 3 is a partially schematic and partially block diagram of the preferred embodiment of the present invention.

DETAILED DESCRIPTION

Figure 1A:
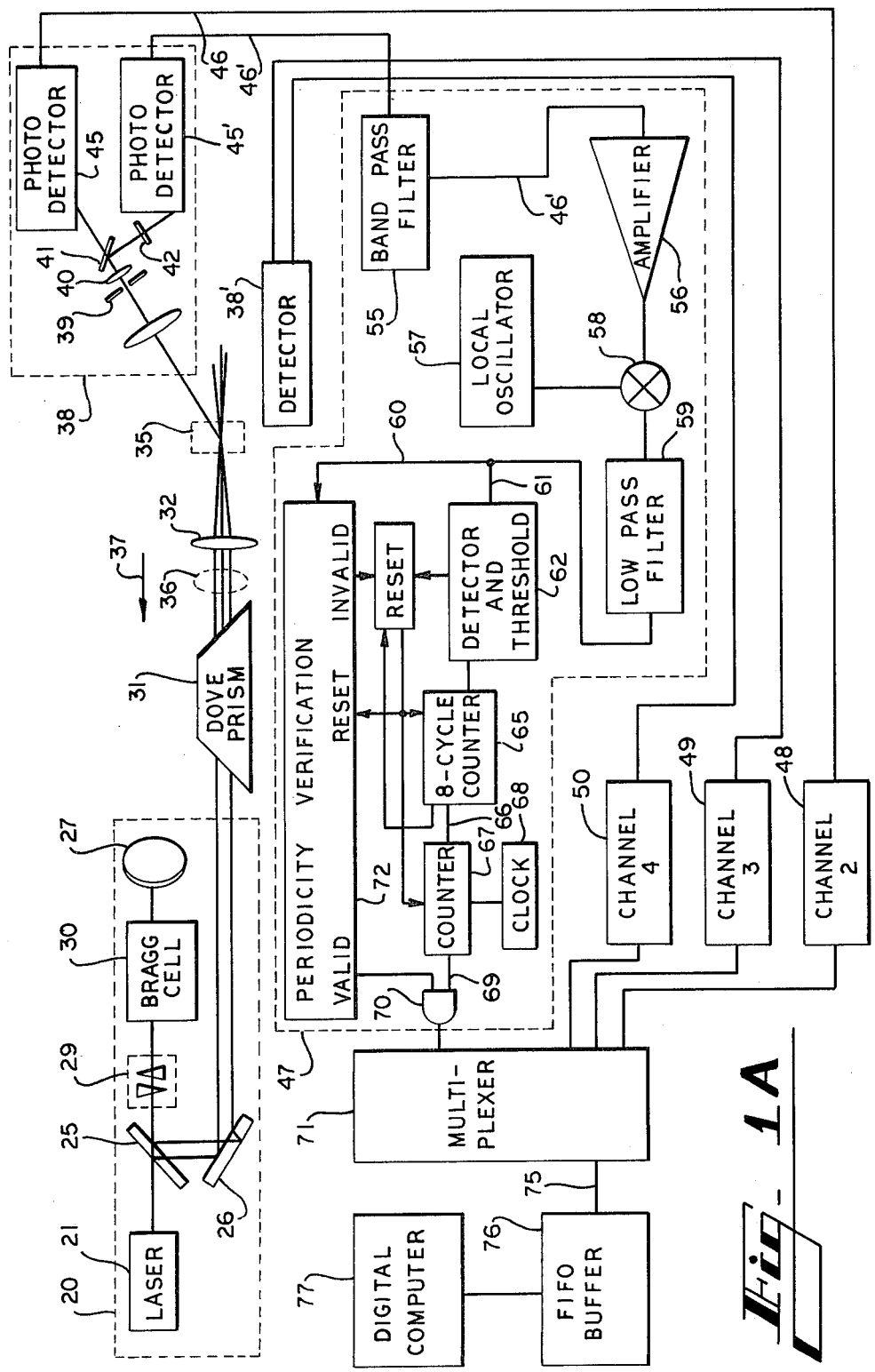
FIG. 1A is a block diagram of a laser velocimeter in which the present invention has been used.

FIG. 1A shows a block diagram of a laser velocimeter in which the present invention has been found to be very useful. The laser velocimeter of FIG. 1A is similar to the laser velocimeter disclosed in report AFAPL-TR-76-65 entitled "The Generation and Radiation of Supersonic Jet Noise, Volume 2, Studies of Jet Noise, Turbulence Structure and Laser Velocimetry Prepared for the Air Force Aero Propulsion Laboratory of the Air Force Systems Command", which technical report is herein incorporated by reference. The laser velocimeter of FIG. 1A includes beam generating apparatus 20 comprising laser 21, beam splitter flats 25 through 28, acromatic wedges 29, Bragg cell 30 and path length compensating prism 33.

A top view of beam generating apparatus 20 is shown in FIG. 1B.

The output of beam generating apparatus 20 is passed through dove prism 31 and lens 32 to form a fringe pattern in volume 35. FIG. 1C shows the arrangement of the beams exiting dove prism 31 as they appear in cross section at a position noted 36 looking in the direction of arrow 37 as shown in FIG. 1A. As may be seen from FIG. 1C the beams comprise a blue beam, a green beam, a blue beam shifted by the frequency of Bragg cell 30 and a green beam shifted by the frequency of Bragg cell 30.

As will be apparent to those skilled in the art of laser velocimetry, an orthogonal fringe pattern will be generated in measurement volume 35. The nature and parameters of this fringe pattern are more fully described in the technical report referenced above. Particles passing through measurement volume 35 will scatter light to photodetectors 45 and 45'. Detector 38, to which detector 38' is identical, includes a pin hole 39, lens 40, 45° filter 41 and filter 42. Separate color components are provided to photodetectors 45 and 45' which are photomultiplier tubes. The outputs of photodetectors 45 and 45' are provided along lines 46 and 46' respectively to signal processing apparatus 47. The content of blocks 48, 49, and 50 is identical to that shown in detail in block 47.

A second fringe pattern generator (not shown) is provided which comprises a duplication of beam generating apparatus 20, dove prism 31 and lens 32. Light scattered from this fringe pattern is sensed by detector 38' which provides inputs to channels 3 and 4 (49 and 50 respectively).

The signal entering signal processing apparatus 47 along line 46', will be a varying signal whose frequency will be determined by the fringe velocity present in volume 35 and a particular component of the velocity of a particle through volume 35 which scattered the light generating said signal.

This signal is processed by signal processing apparatus 47 by passing it through band pass filter 55 to amplifier 56. The output of amplifier 56 is mixed with a signal from local oscillator 57 by mixer 58. This output is low pass filtered at 59 and passes along lines 60 and 61 to the remainder of the signal processing apparatus.

The signal from line 61 is provided to a detector and a threshold detecting means 62 which accepts the lower frequency side bands of the output of mixer 58 which were passed by filter 59. When a signal of a predetermined threshold magnitude is detected by detector and threshold detector 62, it is passed to eight cycle counter 65. Counter 65 provides a logical one along line 66 to counter 67 during eight cycles of the signal provided by detector and threshold detector 62. Counter 67 counts clock cycles from high speed clock 68 during the time the logical one is present on line 66. Thus it may be seen that the count of counter 67 when the logical one disappears from line 66 will be proportional to the time it took eight cycle counter 65 to detect eight cycles of the signal provided as an output from detector 62. The counter output is passed along line 69 through AND gate 70 to data multiplexer 71 if periodicity verification apparatus 72 has verified the periodicity of the output of low pass filter 59. As will be apparent to those skilled in the art, line 69 may represent parallel outputs of counter 67 and has been shown as a single output in order to simplify this description of an environment of the present invention. Data from multiplexer 71 is provided along lines 75 to FIFO buffer 76 which serves as an input buffer to digital computer 77.

The operation of a laser velocimeter such as that shown in FIGS. 1A-1C is described in more detail in the technical report referenced above and has been provided to show a useful application of the present invention. In laser velocimetry, the input to periodicity verification apparatus 72 from line 60 will often be a signal whose frequency is in a range from one to one hundred megahertz. It will therefore be appreciated that very high speed verification of the periodicity of the signal on line 60 must be provided. FIG. 3 shows the preferred embodiment of the present invention which will provide such high speed verification.

Turning to FIG. 2A, a representation of a signal such as that which appears on line 60 in FIG. 1A may be seen. As may be seen from FIG. 2A, such a signal may have cycles of equal time length but varying amplitude and therefore the periodicity verification circuit must respond only to the period of a signal such as that shown as line 60 in FIG. 2A without regard to the amplitude thereof.

In the laser velocimeter shown, noise may be present that will shift the time of a zero crossing on line 60 and eliminate a zero crossing if the noise amplitude is greater than the signal for any given cycle. The present invention is used to prevent such spurious outputs from being processed as valid data.

Figure 2B:
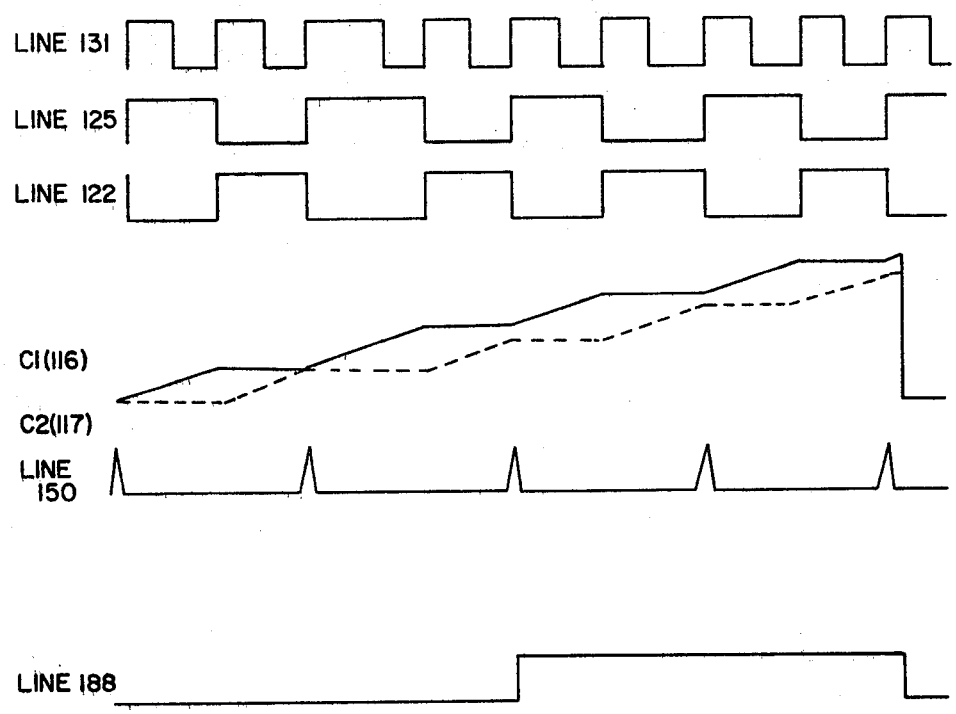
FIG. 2B is a timing diagram of varying waveforms which appear in the present invention when the input signal is aperiodic.

The line labeled 150 in FIG. 2A shows a spike at the times at which the present invention will seek to determine periodicity or aperiodicity and in FIG. 2A a periodic condition is shown. FIG. 2B shows an aperiodic condition.

STRUCTURE OF THE PREFERRED EMBODIMENT

Turning to FIG. 3 it may be seen that the preferred embodiment comprises a reference generator 110 and trigger generator 111 and high speed comparators 112 and 115. The preferred embodiment further comprises capacitors 116 and 117 which are charged by transistors 118 and 119 respectively through diodes 120 and 121. The base of transistor 118 is connected by line 122 to the output of inverter 126. Similarly the base of transistor 119 is connected by line 125 to the output of NAND gate 127. Inverter 126 and NAND gate 127 are controlled by the outputs of flip-flop 128 and latch 129. The output of reference generator 110 appears at point 130. As will be apparent from the description below, during operation of the preferred embodiment, comparators 112 and 115 compare the voltage on each of the capacitors 116 and 117 with a predetermined fraction of the difference between the voltage at point 130 and the voltage on the other capacitor when an output is provided by trigger generator 111.

OPERATION OF THE PREFERRED EMBODIMENT

The operation of the preferred embodiment of the present invention can best be understood by reference to FIGS. 2A and 3. Input at point 60 on FIG. 3 is squared by Schmitt trigger 113 which provides an input along line 131 to the clock input of flip-flop 128. It may thus be seen that if a signal resembling that depicted as line 60 in FIG. 2A is applied to Schmitt trigger 113, the voltage on line 131 will appear substantially as that shown in FIG. 2A for line 131.

Assume that as initial conditions flip-flop 128 and latch 129 have been cleared either by short pulse from reset 132 or in any other suitable manner. The first rising edge of the signal appearing on line 131 sets flip-flop 128, causing a logical one to appear on line 135 and a logical zero to appear on line 136 as shown in FIG. 2A. The output on line 135 also appears on lines 138, 139 and 140. The one on line 138 is inverted by inverter 126 thus cutting off transistor 118 and allowing capacitor 116 (also denoted as C1) to begin charging through forward biased diode 120 and resistor 180. Under these conditions, note that a logical zero appears at point 136 and thus as an input to NAND gate 127, causing a logical one to appear on line 125 at the base of transistor 119. This keeps transistor 119 saturated and prevents charging of capacitor 117 (also noted C2). Similarly the logical zero which appears at point 137 is an input to NAND gate 141, thus causing a logical one to appear on line 142 saturating transistor 145 which controls reference generator 110. The saturation of transistor 145 prevents capacitor 147 (also noted as C3) from charging. These conditions prevail throughout cycle T1 as shown in FIG. 2A, and it may therein be seen that the voltage on capacitor 116 is the only capacitor voltage which shows charging during cycle T1.

The next rising edge to appear on line 131 corresponds to that shown as the end of cycle T1 and beginning of cycle T2 on FIG. 2A. This rising edge clears flip-flop 128, placing a logical zero on line 135 and a logical one at point 136. The transition from zero to one which appears at point 136 also appears at the set input of latch 129, thus placing a logical one at point 137. The zero on line 135 appears on line 138 and is inverted by inverter 126, causing transistor 118 to saturate. Diode 120 prevents capacitor 116 from discharging into the collector of transistor 118. The two logical ones appearing at points 136 and 137 are inputs to NAND gate 127, which cause a logical zero to appear on line 125 turning off transistor 119 and allowing capacitor 117 to charge through diode 121 and resistor 181. Note however that the logical zero on line 135 also appears on line 139 maintaining a logical one on line 142 through the action of NAND gate 141. Therefore, capacitor 147 does not charge during cycle T2. This state prevails during cycle T2 and it may be seen from FIG. 2A that capacitor 117 is charging during cycle T2 while the voltages on capacitors 116 and 147 remain constant.

Now consider the third rising edge to appear on line 131, which denotes the end of cycle T2 and the beginning of cycle T3. This rising edge again toggles flip-flop 128, causing a transition from zero to one to appear on line 135. This transition appears on line 140 as an input to trigger generator 111. Trigger generator 111 comprises inverter 148 and AND gate 149. As will be apparent to those skilled in the art, a transition from zero to one on line 140 will cause a short spike to appear on line 150. This is because there is a small propagation delay associated with inverter 148 and, for a short period of time, line 140 will be in its logical one state but due to the propagation delay from inverter 148 its output will still be a one. The presence of these spikes are shown as the output of line 150 on FIG. 2A. Line 150 is provided to gate inputs 151 and 152 of comparators 112 and 115, respectively, thus causing these comparators to provide an output according to the state of their inputs whenever the voltage spike appears on line 150.

As may be seen from FIG. 2A, if cycle T1 is equal in duration to cycle T2 (as shown in the example in FIG. 2A, the voltage on capacitors 116 and 117 will be equal at the end of cycle T2 (as shown in the example) at the time the spike appears on line 150 causing comparators 112 and 115 to compare their inputs.

The beginning of cycle T3 also initiates the first change in the reference voltage at point 130 by reference generator 110. When all logic states have settled at the beginning of cycle T3, a logical one appears on line 135 and thus on line 139 as an input to NAND gate 141. The other input to NAND gate 141 comes from point 137 which is also a logical one, and therefore line 142 goes to zero cutting off transistor 145 and providing the first charge to capacitor 147 through diode 146 and resistor 182. This sequence is depicted in the timing diagram of FIG. 2A under cycle T3, wherein it may be seen that the first charge on capacitor 147 is initiated at the beginning at cycle T3. Note that during the remaining cycles, capacitor 116 is charging on odd numbered cycles and the voltage thereon remains constant during even number cycles; the opposite is true for capacitor 117. Capacitor 147 charges on the same cycles as capacitor 116 except that it begin charging on cycle T3 rather than T1. Note that the capacitors 116, 117, and 147 are allowed to accumulate charge for the duration of the signal burst which is eight cycles in the preferred embodiment. This avoids the time required by other circuits to discharge the capacitors and reset the circuitry for each cycle.

The voltage on capacitor 147 also appears at point 143. This voltage appears on the positive input to high slew rate operational amplifier 144. Operational amplifier 144 has resistors 161 and 162 associated with its non-inverting input. Negative feedback is provided from a voltage divider comprising resistors 166 and 167, through feedback resistor 165 to the inverting input of amplifier 144. The output of operational amplifier 144 appears at point 130 which is also noted as $V_{REF}$. As is known to those skilled in the art, the selection of resistors 161, 162, and 165 through 167 will control the voltage gain between points 143 and 130 provided by operational amplifier 144. This voltage gain is unity in the preferred embodiment, but may be selected differently for other applications of the present invention. Note also that the use of operational amplifier 144 provides a buffer between point 143 and point 130.

It may therefore be appreciated that at the end of every two cycles appearing on line 131, comparators 112 and 115 make a comparison of the voltages on capacitors 116 and 117 and reference voltage 130 (in a manner to be explained hereinbelow) to determine the equality of the voltages on capacitors 116 and 117. As may be seen from the timing diagram of FIG. 2A, when cycles T1, T2, T3, ... Tn are equal in length, the signal is periodic and at the end of each even numbered cycle, the accumulated voltages on capacitors 116 and 117 will be equal. If any of the cycles T1 through Tn are different in duration from the other cycles, the accumulated voltage on capacitor 116 will differ from that on capacitor 117 upon the next occurrence of a voltage spike on line 150, thus indicating lack of periodicity in the signal appearing on line 60. At the end of a predetermined number of cycles, eight in the preferred embodiment, reset 132 provides a positive voltage pulse. This pulse appears on line 158 as an input to the bases of transistors 155 through 157, thus saturating these transistors. As may be seen from FIG. 3, the saturation of transistors 155 through 157 quickly discharges capacitors 116, 117, and 147. The pulse from reset 132 likewise is provided along lines 159 and 160 to clear latch 129 and flip-flop 128 at the end of the comparison cycle.

OPERATION OF THE COMPARATORS

As may be seen from FIG. 3, comparator 112 compares the voltage at point 172 to the voltage at point 173 and that point 172 has thereon the voltage on capacitor 116. The voltage at point 172 is provided to the noninverting input 168 of comparator 112 and the voltage at point 173 is provided to the inverting input 170. Similarly, comparator 115 compares the voltage between points 174 and 175 provided to noninverting input 171 and inverting input 169, respectively. Turning to comparator 112, it may be seen that the voltage at point 173 will be a voltage difference between the voltage at point 174 (the voltage across capacitor 117) and the reference voltage at point 130 divided by a voltage divider comprising resistors 176 and 177. These resistors have been labeled $R_2$ and $R_1$ respectively in order to make the equations to follow more readable. In a similar manner, comparator 115 compares the voltage at point 174 (that across capacitor 117) to the voltage at point 175. As may be seen from FIG. 3, the voltage at point 175 will comprise a difference between the voltage at point 172 and the reference voltage at point 130 divided by a voltage divider comprising resistors 178 and 179. It is to be noted that capacitor 116 charges through resistor 180 and capacitor 117 charges through resistor 181. Resistors 176 through 181 have been labeled as "$R_x$" (x is an integer) and capacitors 116, 117, and 147 have been labeled C1, C2, and C3, in order to facilitate readability of the following equations.

The voltage input to comparator 112 shown as $V_{112}$ in the drawing may be expressed as follows:

$$V_{112} = V_{c1} - [V_{c2}R_1/(R_1+R_2) + V_{REF}R_2/(R_1+R_2)] \quad (1)$$

as will be apparent from FIG. 3. Equation (1) may be rewritten as:

$$V_{112} = V_{C1} - [V_{C2}R_1/(R_1+R_2) + V_{REF}(1-R_1/(R_1+R_2))]. \quad (2)$$

Ff we define a parameter a as follows:

$$a = R_1/(R_1+R_2) \quad (3)$$

then substitution of equation (3) into equation (2) yields:

$$V_{112} = V_{C1} - V_{C2}a - V_{REF}(1-a) \quad (4)$$

If comparator acceptance limits are defined as $V_{112}$ being greater than or equal to zero, equation (4) may be used to define comparator acceptance limits:

$$0 \geq V_{C1} - V_{C2}a - V_{REF}(1-a). \quad (5)$$

If the voltage on one of the capacitors is defined as $V_{Cn}$ for the nth cycle, then the following expression for the change in voltage across a capacitor may be derived.

$$\Delta V_C = V_{Cn} - V_{C(n-1)} \quad (6)$$

If the feedback circuitry associated with operational amplifier 144 is selected so as to provide unity voltage gain between point 143 and point 130, then the following relationship will be apparent.

$$V_{REF} = V_{C3n} = V_{C1(n-1)} \quad (7)$$

Substituting equation (7) into equation (5) yields the following relationship in terms of comparator acceptance limits.

$$0 \geq V_{C1n} - V_{C2n}a - V_{C1(n-1)}(1-a). \quad (8)$$

Substitution of equation (6) into equation (8) yields $$\Delta V_{C1} \geq (V_{C2n} - V_{C1(n-1)})a. \quad (9)$$

If the signal present on line 60 in FIG. 3 is approximately periodic then the following expression will hold through at the end of each even numbered cycle.

$$V_{C1(n-1)} \cong V_{C2(n-1)} \quad (10)$$

If equation (10) is substituted into equation (9) in view of the definition in equation (6) the following relationships are obtained.

$$\Delta V_{C1} \geq V_{C2}a. \quad (11)$$

$$\Delta V_{C1}/V_{C2} \geq a. \quad (12)$$

Similarly if $R_3$ is made equal to $R_2$ in the circuitry shown in FIG. 3 it follows that $$\Delta V_{C2}/\Delta V_{C1} \geq a. \quad (13)$$

As is known to those skilled in the art, the voltage across a capacitor may be expressed as $$V_C = 1/C \int i\, dt \quad (14)$$

In the preferred embodiment, the time constants for the following RC combinations are chosen such that they are much greater than the period of the input frequency of a signal present on line 60: resistor 180, capacitor 116; resistor 181, capacitor 117; and resistor 182, capacitor 147. Under these circumstances the following relationship may be obtained for a constant current, I, flowing into a capacitor during its charging cycle.

$$i = (V - V_C)/R_5 = I \quad (15)$$

Under these circumstances equation (14) becomes $$\Delta V_C = I/C \int dt = I/C(T) \quad (16)$$

where T is equal to the length of time for the cycle during which the capacitor in question is charging and is the difference of the upper and lower limits on the integral of equation (16). Therefore if equation (16) is substituted into equations (12) and (13) and considering that cycles T1 and T2 are derived from adjacent cycles of the signal present on line 60, the comparator acceptance limits for the combination of comparators 112 and 115 may be expressed as follows.

$$T_2/T_1 \geq a \quad (17)$$

If the comparator window is defined as $$(T_1 - T_2)/T_1 = W, \quad (18)$$

it will be apparent that the window is an expression of the error which the two comparators 112 and 115, taken together, will tolerate. Substitution of equation (18) into equation (17) yields the following:

$$W = I(1-a) \quad (19)$$

It may therefore be seen that the error window tolerated by the comparator circuitry including comparators 112 and 115 is a function of the parameters of two voltage dividers (which are the definition of "a") and the current I flowing into a capacitor during a charging cycle. If the supply voltage V, is selected such that it is considerably greater than the final voltage across any of the capacitors 116, 117, and 147 at the end of the predetermined number of cycles through which the periodicity verification circuit operates, then I may be approximated as a constant for the operation of the circuitry during a predetermined number of cycles (see equation (15)). It will therefore be apparent to those skilled in the art that selection of a as a ratio close to but less than unity provides a very high resolution for the comparator circuitry of the present invention. If the comparator acceptance limits are exceeded i.e. the signal is aperiodic for any comparison made when a voltage spike appears on line 150, then either line 185 or line 186 will go to a logical zero state when the spike appears and thus will cause a logical one to appear on line 188 (FIG. 2B) through the action of NAND gate 187. A logical one on line 188 (FIG. 2B) indicates that the signal present on line 60 is not periodic to within the resolution of the comparator window as defined in equation (19) above.

From the foregoing description of the preferred embodiment, it will be apparent that an embodiment of the present invention may be constructed having a constant reference voltage in the comparator circuitry. While the window will increase as the number of cycles compared increases, such an embodiment still constitutes a useful improvement in periodicity verification for many applications.

From the foregoing it will also be apparent that capacitor 116, diode 120, transistor 118, and resistor 180 comprise a means for integrating the signal present on line 138. It will likewise be apparent that the analogous circuitry associated with capacitors 117 and 147 also provide an integrating function. It will further be evident that Schmitt trigger 113 and flip-flop 128 comprise circuitry having two binary states, which change state in response to the signal present on line 60 undergoing a zero crossing in a positive direction.

The foregoing description of the preferred embodiment of the present invention has been by way of example and it will be understood that the scope of the invention disclosed herein shall be limited only by the following claims:

I claim:

1. Apparatus for detecting an aperiodic characteristic of a signal characterized by a plurality of cycles, each of said plurality of cycles having a time duration characterized by a beginning and an end occurring when said signal crosses a predetermined reference value with a predetermined slope, comprising:
   first means for providing a first voltage proportional to the time duration of a first cycle of said plurality of cycles;
   second means for providing a second voltage proportional to the time duration of a second cycle of said plurality of cycles; and
   third means responsive to said first means and said second means for providing an output when said first voltage does not bear a predetermined relationship to said second voltage, said third means comprising a comparator for comparing said first voltage to a sum of a first predetermined fraction of said second voltage and a second predetermined fraction of a reference voltage and including means for varying said reference voltage in proportion to said time duration of alternate cycles of said plurality of cycles upon an occurrence of a predetermined number of said plurality of cycles.

2. Apparatus as recited in claim 1 wherein: said first and said second means each comprises an integrator for providing a substantially constant current to a capacitor during said time duration of said first and said second cycles respectively.

3. Apparatus as recited in claim 1 wherein:
   said first and said second means comprise alternate cycles of said plurality of cycles and including reset means operatively connected to said first and said second means to restart the operation thereof after a predetermined number of cycles.

4. Apparatus as recited in claim 3 further comprising:
   gating means for rendering said third means inoperative during each said first and second cycle and for rendering said third means operative upon an occurrence of the end of each said second cycle.

5. Apparatus for verifying the periodicity of a signal comprising:
   first means for providing a first binary signal characterized by being alternately in either a first state or a second state;
   said first means changing state in response to said signal crossing a predetermined reference in a predetermined direction;
   second means for providing a second binary signal characterized by being alternately in either said first state or said second state and further characterized by having a state different from said first binary signal; third means responsive to said first means for providing a first voltage proportional to a time integral of said first binary signal;
   fourth means responsive to said second means for providing a second voltage proportional to a time integral of said second binary signal; and
   fifth means responsive to said third means and said fourth means for providing a warning signal when said first voltage and said second voltage do not bear a predetermined relationship,
   said third means comprising a comparator for comparing said first voltage to a sum of a first predetermined fraction of said second voltage and a second predetermined fraction of a reference voltage, and including means for varying said reference voltage in proportion to said time duration of alternate cycles of said plurality of cycles upon an occurrence of a predetermined number of said plurality of cycles.

6. Apparatus as recited in claim 5 further comprising:
   a sixth means for rendering said fifth means responsive to said first voltage and said second voltage upon each occurrence of said first binary signal making a transition from said second state to said first state.

7. Apparatus for verifying the periodicity of a signal comprising:
   dividing means responsive to said signal for providing a pair of output signals alternately having a first state and a second state, one of said output signals being in said first state when the other of said output signals is in said second state; wherein said output signals each change state in response to said signal passing through a predetermined reference value in a predetermined direction; integrating means responsive to said pair of output signals for providing a pair of period signals; and comparator means for providing a comparator output when one of said pair of period signals bears a predetermined relationship to the other of said pair of period signals, said comparator means including reference means for providing a reference signal proportional to a number of times a predetermined one of said pair of output signals has been in said first state and said predetermined relationship is one of said pair of period signals being greater than a first predetermined fraction of said reference signal plus a second predetermined fraction of the other of said pair of period signals.

* * * * *